United States Patent [19]

Schwartz

[11] 4,030,010

[45] June 14, 1977

[54] TIME DELAY CONTROL CIRCUIT

[75] Inventor: Norman L. Schwartz, Stony Brook, N.Y.

[73] Assignee: Multiplex Communications, Inc., Hauppauge, N.Y.

[22] Filed: Feb. 13, 1975

[21] Appl. No.: 549,764

[52] U.S. Cl. .............................. 318/487; 307/234; 307/141.4; 328/112
[51] Int. Cl.² .......................................... H02P 1/10
[58] Field of Search .......... 318/484, 452, 453, 454, 318/487; 307/141, 141.4, 234; 328/111, 112

[56] References Cited

UNITED STATES PATENTS

| 3,564,285 | 2/1971 | Gilbert | 307/234 |
| 3,676,699 | 7/1972 | Warren | 307/234 |
| 3,693,101 | 9/1972 | Trimble | 328/177 |
| 3,701,029 | 10/1972 | Hogg | 328/91 |
| 3,898,481 | 8/1975 | Glaser | 307/235 R |
| 3,922,611 | 11/1975 | Kanitz | 328/111 |

OTHER PUBLICATIONS

Benson, Jr. et al., "Pulse-width discriminator uses Unijunction Transistor", *Electronic Design*, Mar. 1, 1968.
Whittington et al., "Versatile Discriminator Measures Pulse Length", *Electronics*, vol. 35, No. 31, Aug. 3, 1962.

*Primary Examiner*—Robert K. Schaefer
*Assistant Examiner*—John J. Feldhaus
*Attorney, Agent, or Firm*—Hopgood, Calimafde, Kalil, Blaustein & Lieberman

[57] ABSTRACT

A flip-flop is arranged to be set by a first comparator and reset by a second comparitor. A first capacitor and a first resistor are connected between the input terminals of the circuit with the first comparator connected across the first resistor and the second comparator connected across the second resistor. The flip-flop is set and reset with time delays determined by the charging times of their respective associated capacitors. No external bias supply is required.

6 Claims, 1 Drawing Figure

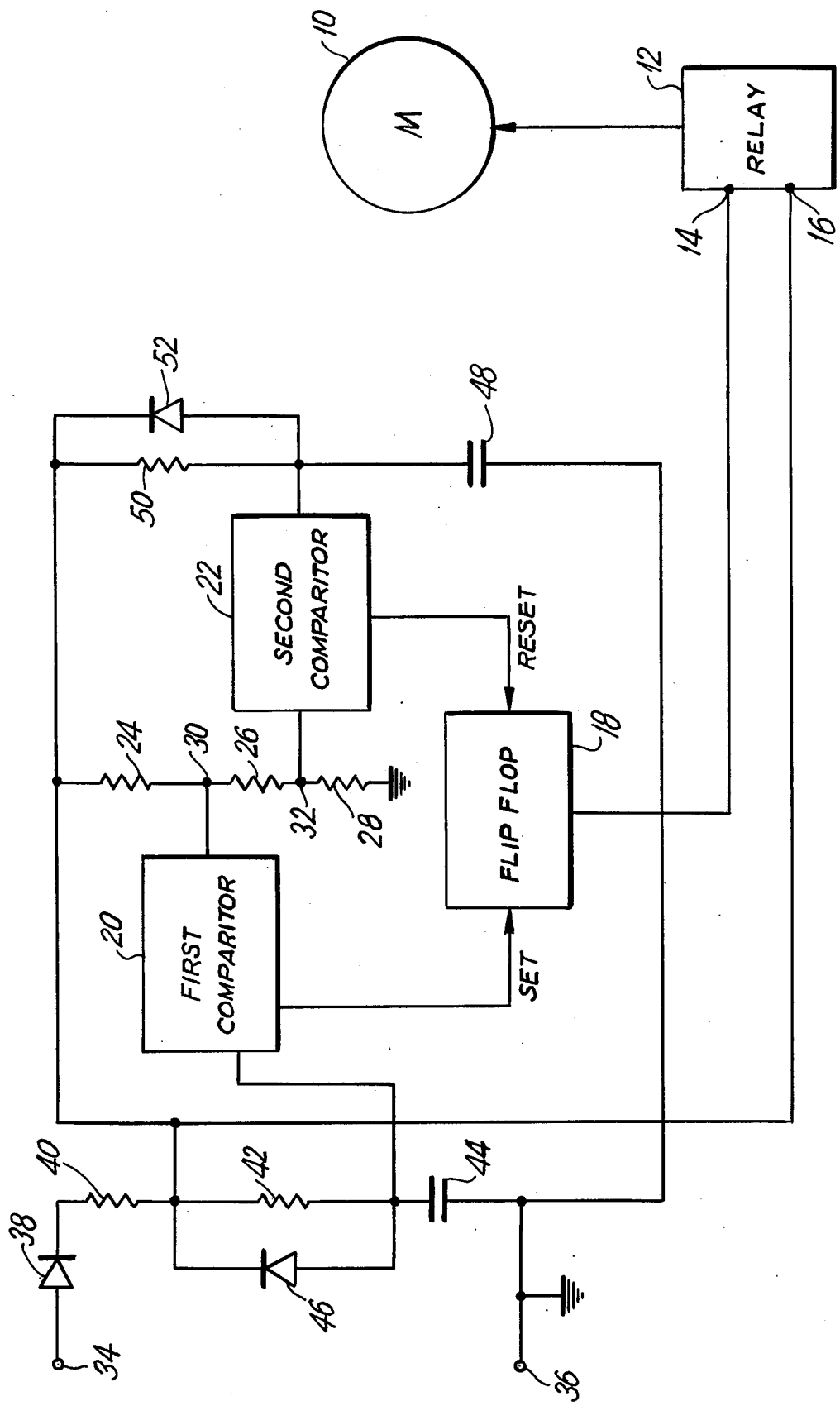

TIME DELAY CONTROL CIRCUIT

BACKGROUND OF THE INVENTION

This invention relates to a control circuit in which changes in the input signal are reflected in the output signal only after a predetermined delay.

It is known to utilize a flip-flop to determine the output of a control circuit. Conventionally, the flip-flop is, in turn, controlled by two comparators, one for "set" and one for "reset". Such circuits are used, for example, to control, through a relay the operation of an electric motor such as the motor of a teleprinter. The delay prevents the motor from being turned off in response to a constant voltage input of short duration.

Previously known control circuits of this type have been characterized by undesirable complexity and the need for a separate external bias supply. Such circuits have not taken full advantage of commercially available integrated circuitry for timing purposes.

SUMMARY OF THE INVENTION

According to the present invention a time delay control circuit includes a flip-flop set and reset by first and second comparators respectively. A first resistor and a first capacitor are connected in series across the input terminals of the circuits with the first resistor also connected across the first capacitor. In the preferred embodiment a second resistor and a second capacitor are connected in series with each other and in parallel with the first resistor and capacitor. The charging time of the first capacitor through the associated series resistor determines the delay with which the flip-flop responds to changes in the input signal.

The comparators and flip-flop can readily be constructed as a single integrated circuit to which the other circuit components are external. In a preferred embodiment, diodes are provided in parallel with the first and second resistors to permit rapid discharge of the capacitors in response to a current flow opposite to that which changes the capacitor.

BRIEF DESCRIPTION OF THE DRAWINGS

An understanding of additional aspects of the invention can be gained from a consideration of the following detailed description of a representative embodiment of the invention taken in conjunction with the appended schematic drawing which shows the circuitry of the invention.

DESCRIPTION OF THE PREFERRED EMBODIMENT

The drawing shows the time delay control circuit of the present invention which is utilized to activate and deactivate the drive motor 10 of a teleprinter. The motor 10 is directly responsive to a relay 12. An appropriate relay for this purpose is disclosed in U.S. Pat. No. 3,767,942 entitled "Solid State Relay" and issued to me on Dec. 23, 1973. The relay shown in the drawing appended hereto includes two input terminals 14 and 16 which correspond to the terminals 16 and 17, respectively, of the above-mentioned patent.

The input to the relay 12 is determined by a flip-flop 18. The state of the flip-flop is, in turn, controlled by a first comparator 20 used to set the flip-flop 18 and a second comparator 22 used to reset the flip-flop 18. The reference levels for the comparators 20 and 22 are determined by a voltage divider consisting of three series resistors, 24, 26 and 28, the last-mentioned resistor being connected directly to ground. The reference level of the first comparator 20 is taken from a junction 30 between the resistors 24 and 26, while the reference level of the second comparator 22 is taken from a junction 32 between the resistors 26 and 28. The above-described flip-flop, comparators and voltage divider are available as a single chip integrated circuit known commercially as "Timer 555" and sold by Signetics Corporation of Sunnyvale California.

External to the integrated circuit described above are various solid state components which give rise to the desired time delay after which the flip-flop 18 and relay 12 are activated. This external circuitry includes two input terminals 34 and 36 to which the incoming signal is applied. In the environment disclosed here, this signal is the input to a teleprinter. Such an input signal presents a constant input voltage across the terminals 34 and 36 when no information is transmitted. Information is represented by interruptions of short duration in the input signal. It is desired to activate the motor 10 when interruptions are present in the input signal and to deactivate the motor 10 when no information is being received and the interruptions cease. However, it is essential that the circuitry which deactivates the motor 10 not be responsive to steady voltage conditions of relatively short duration that exist between information-representing signal interruptions.

Input terminal 36 is at ground potential. Thus, the presence of an input signal voltage is represented by a voltage at the terminal 34. This voltage produces a current flow through a diode 38 and a resistor 40 into a resistor 42 and a capacitor 44. The other side of the capacitor 44 is connected to the input terminal 36. The first comparator 20 is connected across the resistor 42.

When there is a pause in the information transmitted a voltage is present at steady terminal 34 and current flows through the resistor 42 to charge the capacitor 44. After a delay period determined by the time constant of a first timing circuit comprising resistor 42 and capacitor 44, the capacitor 44 has charged to a predetermined voltage which activates comparator 20 which, in turn, sets flip-flop 18. When set, flip-flop 18 energizes relay 12 to deactivate motor 10 which motor 10 is activated when the inventive circuit is not operative. In this embodiment, to provide more rapid discharge of the capacitor 44, a diode 46 is arranged parallel with the resistor 42.

A second capacitor 48 and another resistor 50 are connected in series with each other and in parallel with the capacitor 44 and resistor 42. The second comparator 22 is connected to the junction of the resistor 50 and capacitor 48. The capacitor 48 second comparator 22 when it has charged to a predetermined voltage to reset the flip-flop 18. A diode 52 is connected in parallel with the resistor 50 to provide rapid discharge of the capacitor 48.

It will be understood that the above circuit efficiently provides for the actuation of the flip-flop 18 and relay 12 in response to a cessation of information flow represented by voltage variations across the terminals 34 and 36, but only if this interruption is of sufficient duration to permit a charging of the capacitor 44. This time delay introduced by the capacitor 44 prevents continuous activation and deactivation of the teleprinter motor 10. The above operation is entirely responsive to the input signal applied at the terminals 34 and 36. The circuit has no other input terminals and does not require an external bias source as do prior art timing circuits used for this purpose.

It will be obvious to those skilled in the art that the above-described embodiment is meant to be merely exemplary and that it is susceptible of my modification and variation without departing from the spirit and scope of the invention. Therefore, the invention should not be deemed limited except as defined by the appended claims.

I claim:

1. A time delay control circuit comprising, a pair of input terminals, a capacitor, and a resistor arranged in series between the input terminals, a flip-flop, a first comparator connected across the resistor to set the flip-flop, a second comparator connected to one of the input terminals to reset the flip-flop, and resistance means connected across said input terminals and to each of said comparators to generate bias voltages for said comparators when voltage is applied across said input terminals, whereby the flip-flop is set in accordance with variations in the signal applied to the input terminals which are of a predetermined minimum duration established by the charging time of the capacitor.

2. The circuit of claim 1, further comprising a relay controlled by the output of the flip-flop, the relay being connected to the drive motor of a teleprinter.

3. A time delay control circuit including:
a pair of input terminals;
a first series circuit including a first resistance and a first capacitor having a first charging time connected across said input terminals;
a second series circuit including a second resistance and a second capacitor having a second charging time shorter than said first charging time connected in parallel with said first series circuit;
a flip-flop;
resistance means connected across said input terminals to generate bias voltages when a voltage is applied across said input terminals;
a second comparator connected between said resistance means and the junction point of said second resistance and said second capacitor, the output of said second comparator being connected to said flip-flop to reset said flip-flop after said second charging time; and
a first comparator connected between said resistance means and the junction point of said first resistance and said first capacitor, the output of said first comparator being connected to said flip-flop to set said flip-flop after said first charging time.

4. The circuit of claim 3 further including a relay connected to and controlled by the output of said flip-flop, said relay being connected to the drive motor of a teleprinter and being adapted to deactivate said drive motor when said flip-flop is set.

5. The circuit of claim 3 further comprising a first diode connected across the first resistor and a second diode connected across the second resistor to provide rapid discharge of said capacitors.

6. The circuit of claim 3, wherein the first and second comparator and the flip-flop form a single integrated circuit, all other components being external to the integrated circuit.

* * * * *